United States Patent [19]

Sano et al.

[11] 4,438,353
[45] Mar. 20, 1984

[54] I²L CIRCUIT WITH A VARIABLE INJECTOR CURRENT SOURCE

[75] Inventors: Jun Sano, Tokyo; Masahide Aoyama; Daijiro Kubo, both of Yokohama, all of Japan

[73] Assignee: Tokyo Shibaura Denki Kabushiki Kaisha, Japan

[21] Appl. No.: 261,617

[22] Filed: May 7, 1981

[30] Foreign Application Priority Data

May 14, 1980 [JP] Japan ................................ 55-63641

[51] Int. Cl.³ ...................... H03L 5/00; H03K 19/091
[52] U.S. Cl. .................................. 307/477; 307/297; 307/459
[58] Field of Search ............... 307/477, 459, 443, 297, 307/296 R; 357/92

[56] References Cited

U.S. PATENT DOCUMENTS

| | | | |
|---|---|---|---|
| 3,816,758 | 6/1974 | Berger et al. | 307/459 |
| 4,013,901 | 3/1977 | Williams | 307/477 X |
| 4,053,923 | 10/1977 | Kang | 307/477 X |
| 4,100,431 | 7/1978 | Stipanuk | 307/297 X |
| 4,112,670 | 9/1978 | Morozumi | 307/459 X |
| 4,137,465 | 1/1979 | Hart | 307/477 |
| 4,381,010 | 4/1983 | Thompson et al. | 307/459 X |

Primary Examiner—Larry N. Anagnos
Assistant Examiner—David R. Hudspeth
Attorney, Agent, or Firm—Finnegan, Henderson, Farabow, Garrett & Dunner

[57] ABSTRACT

An I²L logic circuit provided with a logic section which includes at least one I²L unit circuit formed of a transistor for injector and a driving transistor.

The I²L logic circuit is further provided with a supply circuit for supplying the I²L unit circuit with an injector current corresponding to a control signal. The supply circuit is formed of a first circuit for steadily supplying the I²L unit circuit with a predetermined injector current, and a second circuit for supplying the I²L unit circuit with another injector current in accordance with the control signal, the first and second circuits being connected in parallel with each other.

16 Claims, 10 Drawing Figures

I²L CIRCUIT WITH A VARIABLE INJECTOR CURRENT SOURCE

This invention relates to an I²L logic circuit including I²L unit circuits.

As compared with circuits formed of conventional bipolar transistors, I²L logic circuits including I²L unit circuits formed of pnp transistors for injectors and driving npn transistors have the advantage of reduced current consumption and higher degree of integration. Such I²L logic circuits have a further advantage in being able to coexist with linear circuits. In one such logic circuit composed of the I²L unit circuits, the npn transistor of one of the I²L unit circuits serving as a gate is sure to be in the on state, and an injector current continues to flow without regard to the state of logic operation.

FIG. 1 is a circuit diagram showing an example of the prior art I²L logic circuit. Each I²L unit circuit 20 is composed of a pnp transistor 22 for injector and a driving npn transistor 24. The collector of the pnp transistor 22 for injector is connected to the base of the driving npn transistor 24, and the base of the pnp transistor 22 and the emitter of the npn transistor 24 are connected in common and grounded. Further, the base of the driving transistor 24 forms a signal input terminal of the I²L unit circuit 20, while the collector of the transistor 24 forms a signal output terminal of the circuit 20. The signal output terminal of one I²L unit circuit 20 is connected to the signal input terminal of another I²L unit circuit 20 adjacent thereto to form a logic section 26. The respective emitters (injectors) of the pnp transistors 22 of the I²L unit circuits 20 forming the logic section 26 are connected to an injector line 28. The injector line 28 is supplied with a positive reference voltage $V_{REF}$ through a resistor 30.

In the aforementioned prior art I²L logic circuit, the injector current value is set in accordance with the reference voltage $V_{REF}$ and the resistance of the resistor 30. The set amount of current is sure to flow even when the logic section 26 is not in logical operation, as well as while the logic section 26 is in logical operation.

Meanwhile, there is such a relationship as shown in FIG. 2 between the current consumption (injector current) and operating speed (signal delay time) in an I²L unit circuit. That is, a great injector current is required in order to reduce the signal delay time for higher operating speed. In maintaining only the logical state without taking account of the signal delay time, on the other hand, it is necessary only to flow a very small injector current.

In order to increase the operating speed in the prior art I²L logic circuit, therefore, it is necessary to lower the resistance of the resistor 30 to provide a relatively large injector current flow. However, a great injector current would flow even in a low-speed operation or a logical state hold mode which requires no great injector current, resulting in a waste of current.

The object of this invention is to provide an I²L logic circuit capable of controlling the injector current value in accordance with a required operating speed, thereby saving a waste of current.

To achieve the above object, an I²L logic circuit according to this invention comprises a logic section including at least one I²L unit circuit formed of a transistor for injector and a driving transistor, and a supply means for supplying the I²L unit circuit with an injector current corresponding to a control signal. The supply means is formed of a first supply means for steadily supplying the I²L unit circuit with a predetermined injector current, and a second supply means for supplying the I²L unit circuit with another injector current in accordance with the control signal, the first and second supply means being connected in parallel with each other.

Other objects and advantages of the invention will become apparent from the following detailed description when taken in conjunction with the accompanying drawings, in which.

Figure 1:
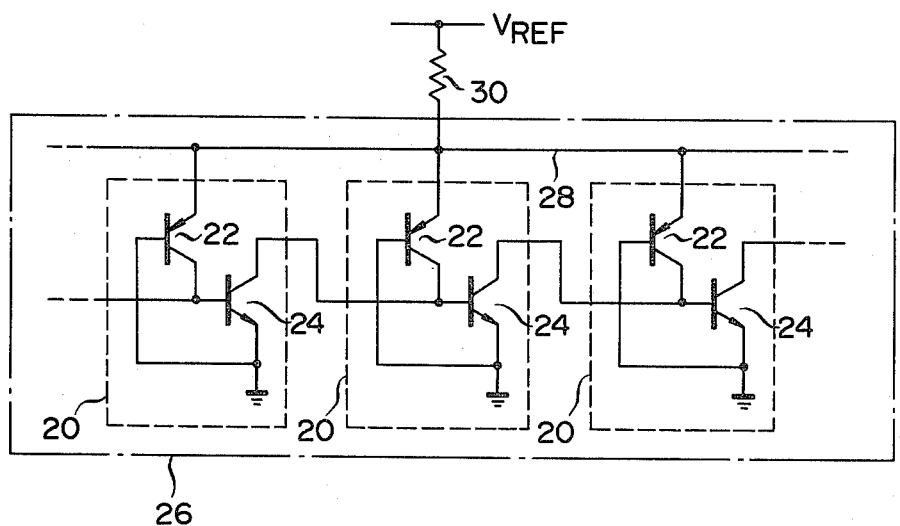
FIG. 1 is a circuit diagram of a prior art I²L logic circuit.
Figure 2:
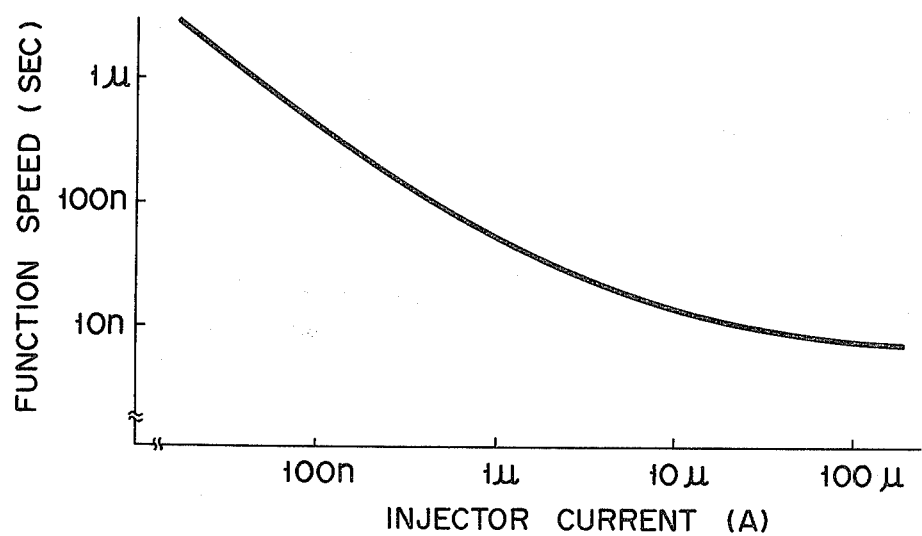
FIG. 2 shows a characteristic curve for illustrating the relationship between the current consumption and operating speed in an I²L unit circuit.
Figure 3:
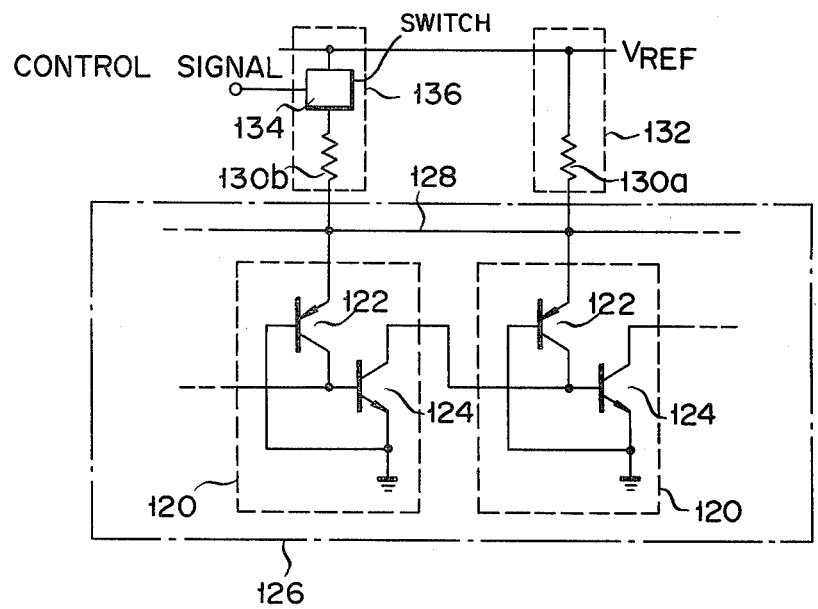
FIG. 3 is a circuit diagram showing an embodiment of this invention.

Referring now to the drawing of FIG. 3, there will be described an embodiment of this invention. An I²L unit circuit 120 is composed of a pnp transistor 122 for injector and an npn transistor 124 for drive. The collector of the pnp transistor 122 for injector is connected to the base of the driving npn transistor 124, and the base of the pnp transistor 122 and the emitter of the npn transistor 124 are connected in common and grounded. Further, the base of the driving transistor 124 forms a signal input terminal of the I²L unit circuit 120, while the collector of the transistor 124 forms a signal output terminal of the circuit 120. The signal output terminal of one I²L unit circuit 120 is connected to the signal input terminal of another I²L unit circuit 120 adjacent thereto, and thus a logic section 126 is formed of a plurality of such I²L unit circuit 120. The respective injectors of these I²L unit circuits forming the logic section 126 are connected to an injector line 128.

A current is supplied to the injector line 128 by a first current supply means 132 for supplying a reference potential $V_{REF}$ to the injector line 128 through a resistor 130a, and a second current supply means 136 for supplying the reference potential $V_{REF}$ to the injector line 128 through a resistor 130b and a switch circuit 134 that are connected in series with each other. The resistance value of the resistor 130a of the first current supply means 132 is predetermined so that the injector current which is continually supplied to the I²L unit circuits 120 may be held to a minimal, necessary extent. The switch circuit 134 of the second current supply means 136 is operated in accordance with a control signal. That is, the switch circuit 134 is closed when the logic section 126 need to be operated at high speed. When the switch circuit 134 is closed, the injector current is supplied to the injector line 128 via the two parallel-connected resistors 130a and 130b, so that a great injector current flows through the I²L unit circuits 120 of the logic section 126 to enable high-speed operation of the logic section 126. The resistance value of the resistor 130b of the second current supply means 136 is such a value that the injector current which is supplied to the injector line 128 when the switch circuit 134 is closed is sufficient to duly execute the logic speed.

In a low-speed operation or in a hold mode, on the other hand, the switch circuit 134 is opened. In this case, only the minimum necessary injector current flows through the I²L unit circuits 120. A semiconductor switching element such as e.g. a transistor is used for the switch circuit 134.

Thus, according to the above-mentioned embodiment of the invention, the minimum necessary injector current is caused continually to flow through the I²L unit circuits 120 via the resistor 130a, and another injector current will be caused to flow via the other resistor 130b if the logic section 126 requires high-speed operation. Accordingly, there is no possibility of a waste of current. Further, the logic section 126 will never be prevented from performing high-speed operation.

Figure 4:
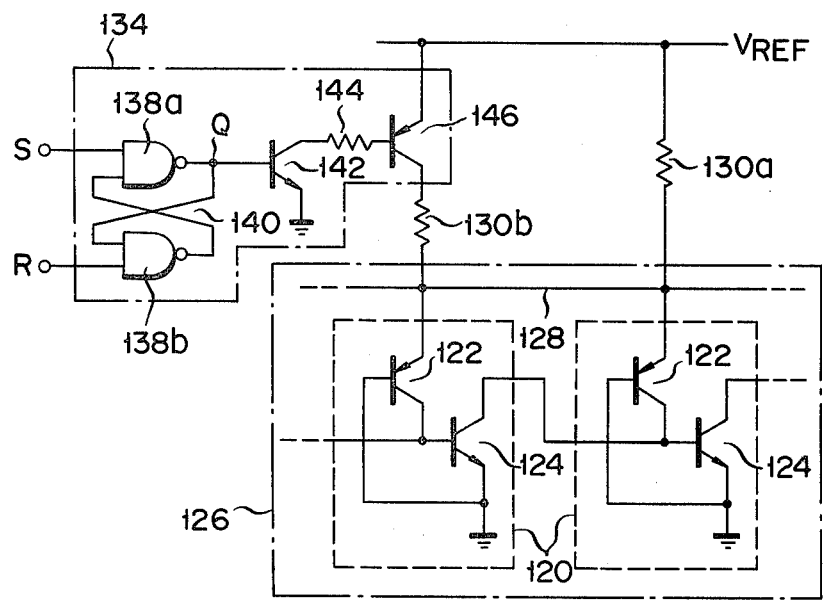
FIGS. 4 to 10 are circuit diagrams showing various alternative embodiments of the invention.

FIG. 4 shows a specific example of the switch circuit 134 in the aforementioned embodiment. The switch circuit 134 comprises a flip-flop circuit 140 composed of first and second NAND gates 138a and 138b, an npn transistor 142 whose base is supplied with an output Q of the flip-flop circuit 140 and whose emitter is grounded, and a pnp transistor 146 whose base is connected with the collector of the npn transistor 142 through a resistor 144, whose emitter is supplied with the reference potential V$_{REF}$, and whose collector is connected to the resistor 130b of the second current supply means. A set signal S is supplied to a first input terminal of the first NAND gate 138a whose second input terminal is connected to the output terminal of the second NAND gate 138b. A reset signal R is supplied to a first input terminal of the second NAND gate 138b whose second input terminal is connected to the output terminal of the first NAND gate 138a.

In a high-speed operation of the logic section 126 in the I²L logic circuit of the above-mentioned construction, the set signal S at low level is supplied to the first NAND gate 138a. When supplied with the set signal S, the flip-flop circuit 140 is set, and its output Q goes high. Then, the npn transistor 142 and hence the pnp transistor 146 are turned on, so that the injector current is supplied to the injector line 128 through the resistor 130b.

When the reset signal R at low level is supplied to the second NAND gate 138b after the period for the high-speed operation has terminated, the flip-flop circuit 140 is reset to turn off both the npn transistor 142 and the pnp transistor 146. As a result, the injector current is supplied to the injector line 128 only through the resistor 130a.

An injector current I$_{off}$ obtained when the npn and pnp transistors 142 and 146 are off is given by $$I_{off} = \frac{V_{REF} - V_{RE}}{R_1}$$

where R$_1$ is the resistance of the resistor 130a, and V$_{RE}$ is the potential of the injector line 128 at approximately 0.7 V.

On the other hand, an injector current I$_{on}$ obtained when the set signal S is supplied to the flip-flop circuit 140 to turn on the npn and pnp transistors 142 and 146 is given by $$I_{on} = \frac{V_{REF} - V_{RE}}{R_2}$$

where R$_2$ is the parallel combined resistance of the resistors 130a and 130b, provided that the saturation voltage of the pnp transistors 146 is disregarded. Since R$_2$ is smaller than R$_1$, we have I$_{off}$<I$_{on}$.

The set and reset signals S and R may be obtained from chip-enable signals of a memory or inhibiting signals for stopping circuit operations.

Figure 5:
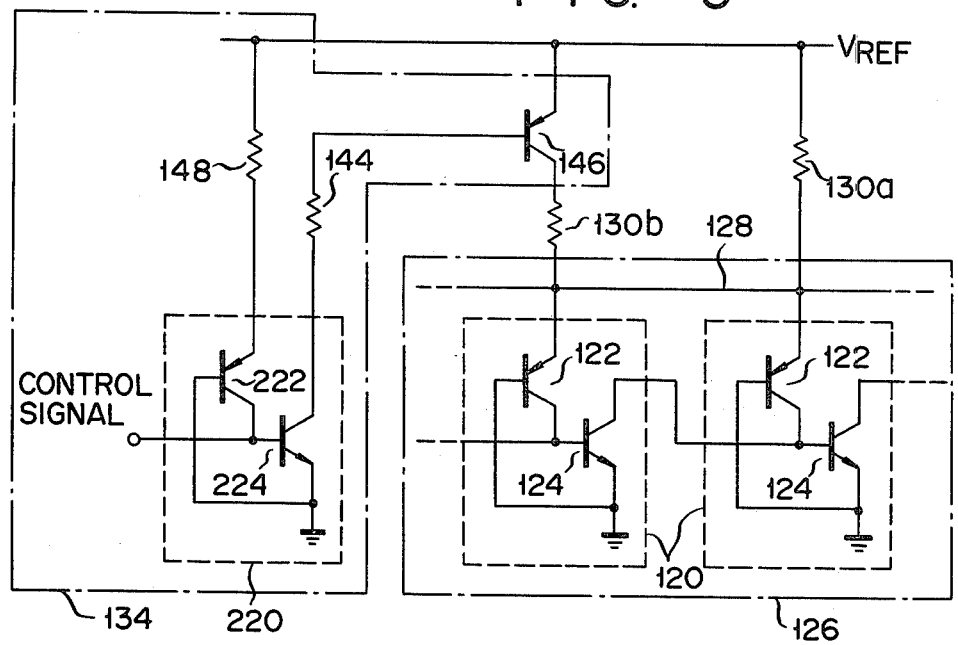

FIG. 5 shows another example of the switch circuit 134. This switch circuit 134, unlike the switch circuit of FIG. 4, is so constructed that the control signal is supplied to the base of the pnp transistor 146 through another I²L unit circuit 220. Namely, the control signal is supplied to the base of a driving transistor 224 of the I²L unit circuit 220, the collector of the driving transistor 224 being connected to the base of the pnp transistor 146 through the resistor 144. Further, the reference potential V$_{REF}$ is supplied to the emitter of a pnp transistor 222 for injector of the I²L unit circuit 220 through a resistor 148.

In the above-mentioned construction, the I²L unit circuit 220 is supplied with an injector current via the resistor 148. When the control signal is at low level, the pnp transistor 146 is turned off, and the injector current is supplied to the logic section 126 only through the resistor 130a. When the control signal is at high level, on the other hand, the pnp transistor 146 is turned on, and the injector current is supplied to the logic section 126 through the two resistors 130a and 130b in parallel.

Figure 6:
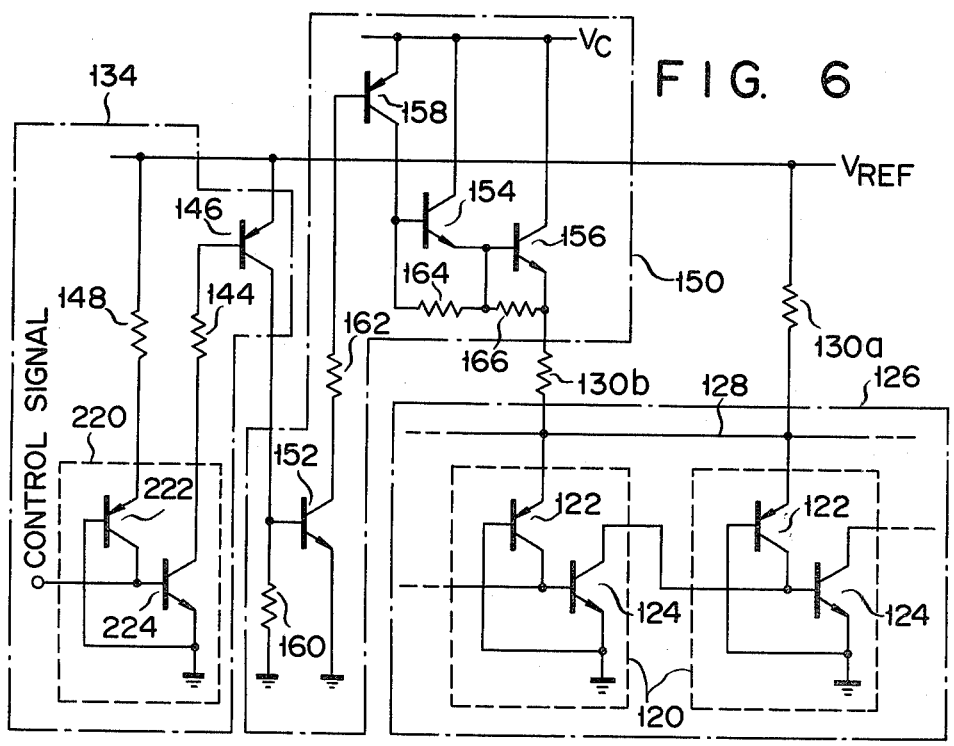

FIG. 6 shows a further embodiment of the I²L logic circuit in which the output current of the switch circuit of FIG. 5 is amplified by using a current amplifier circuit 150. The current amplifier circuit 150 is composed of first to third npn transistors 152, 154 and 156, a pnp transistor 158, and first to fourth resistors 160, 162, 164 and 166. The base of the first npn transistor 152 is connected to the collector of the pnp transistor 146 which is the output of the switch circuit, and grounded through the first resistor 160. The first npn transistor 152 has its emitter also grounded and its collector connected to the base of the pnp transistor 158 through the second resistor 162. The pnp transistor 158 has its emitter supplied with a source voltage V$_C$ and its collector connected to the base of the second npn transistor 154 and one end of the third resistor 164. The second npn transistor 154 has its collector supplied with the source voltage V$_C$ and its emitter connected to the base of the third npn transistor 156, the other end of the third resistor 164, and one end of the fourth resistor 166. The third npn transistor 156 has its collector supplied with the source voltage V$_C$ and its emitter connected to the other end of the fourth resistor 166 and to the resistor 130b so that the amplified injector current may be supplied to the injector line 128 of the logic section 126.

If a power supply line for supplying the source voltage V$_C$ exists in the vicinity of the logic section 126, the I²L logic circuit of this embodiment can be operated at higher speed since higher injector current can be supplied to the logic circuit 126.

Figure 7:
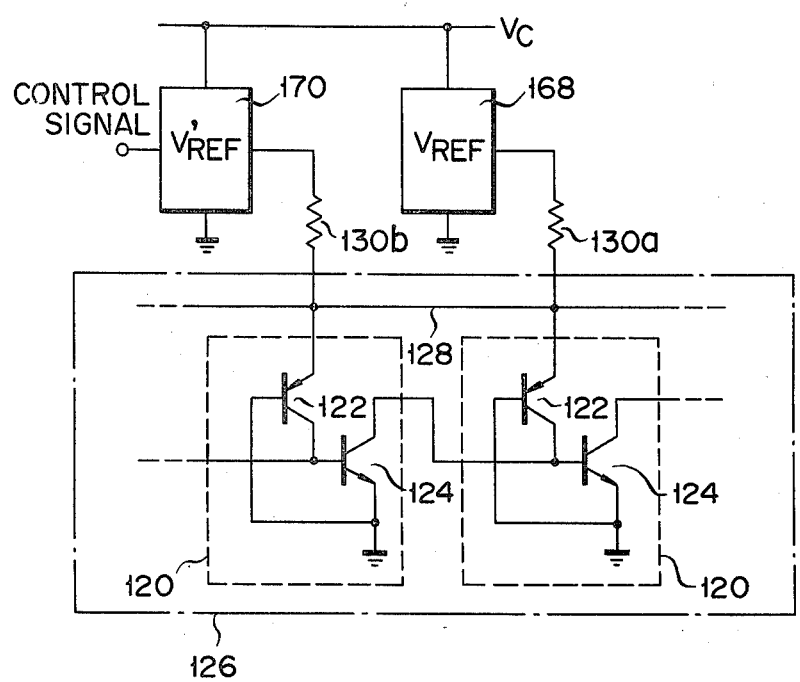

FIG. 7 is a circuit diagram showing another embodiment of the invention. The injector line 128 of the logic section 126 is supplied with injector currents from a first voltage generator 168 producing a first reference voltage V$_{REF}$ and a second voltage generator 170 producing a second reference voltage V'$_{REF}$ in accordance with the control signal through resistors 130a and 130b, respectively. The first and second voltage generators 168 and 170 are supplied at their respective one ends with the source voltage V$_C$ and grounded at their other ends. The logic section 126 of the I²L logic circuit of this embodiment is supplied by the first voltage generator 168 with the minimum necessary injector current for the circuit, and is supplied by the second voltage generator 170 with an additionally required current for high-speed operation in accordance with the control signal.

Figure 8:
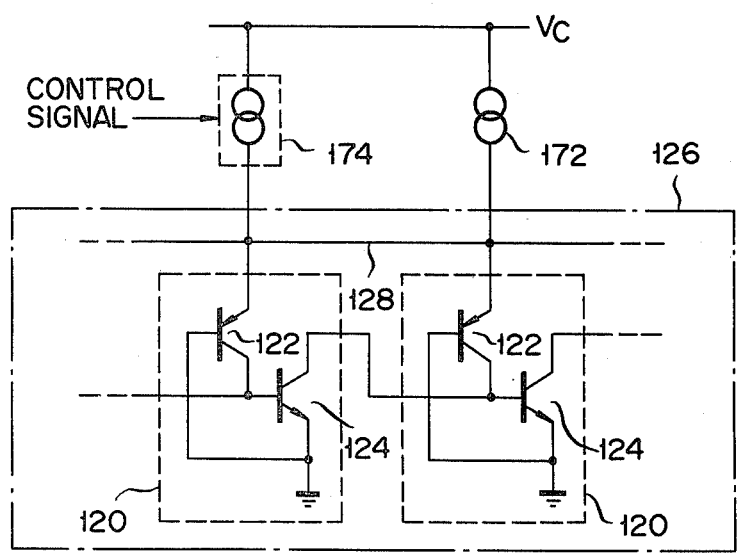

FIG. 8 shows still another embodiment. The logic section 126 of the I²L logic circuit of this embodiment is supplied with injector currents from first and second constant-current sources 172 and 174 disposed in parallel with each other. The minimum necessary current of the I²L logic circuit is supplied from the first constant-current source 172 to the injector line 128, and the additionally required current for high-speed operation is supplied from the second constant-current source 174 to the injector line 128 in accordance with the control signal. The first and second constant-current sources 172 and 174 are driven by the source voltage $V_C$.

Figure 9:
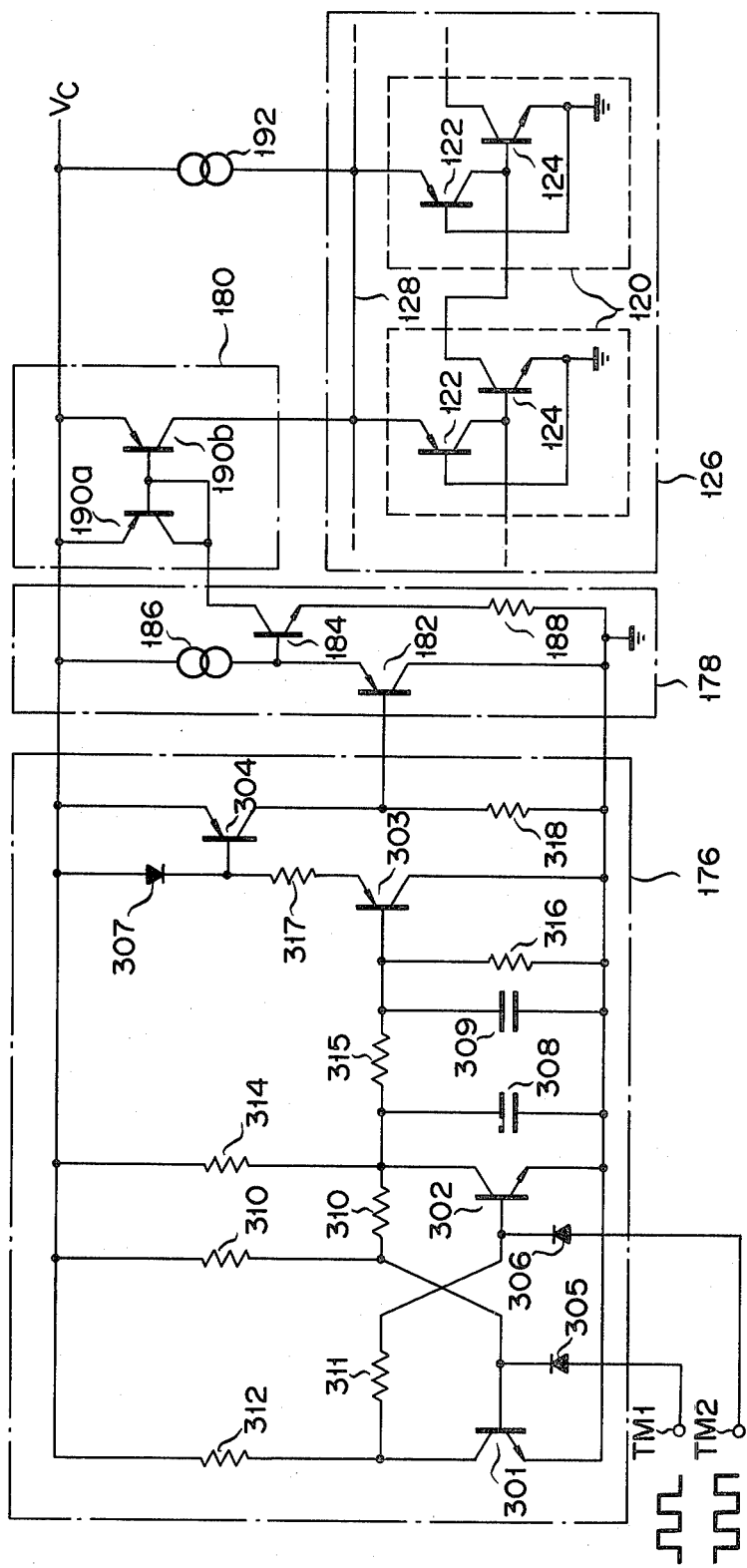

FIG. 9 shows a further embodiment of the invention. In the embodiments of FIGS. 3 to 8, the additional injector current supplied only when the logic section 126 of the I²L logic circuit is operated at high speed takes a fixed value. In this embodiment, however, the injector line 128 is supplied with an injector current corresponding to the operating speed of the logic section 126 by using a frequency-voltage converter circuit 176.

A control signal input terminal of the frequency-voltage converter circuit 176 is supplied with an input signal for the logic section 126 of the I²L logic circuit or a signal of the same frequency as that of such input signal. The output voltage of the frequency-voltage voltage converter circuit 176 is supplied to a voltage-current converter circuit 178, where it is converted into a current. This current is supplied to the injector line 128 of the logic section 126 of the I²L logic circuit through a current mirror circuit 180 adjoining the voltage-current converter circuit 178.

The frequency-voltage converter circuit 176 is formed of npn transistors 301 and 302, pnp transistors 303 and 304, diodes 305, 306 and 307, capacitors 308 and 309, and resistors 310 to 318. The base of the npn transistor 301 is connected through the diode 305 to a first terminal TM1 which is supplied with a first signal, and to one end of the resistor 313 which is connected to one end of the resistor 310. The other end of the resistor 313 is supplied with the source voltage $V_C$. Further, the npn transistor 301 has its emitter grounded and its collector connected to one end of the resistor 311 and one end of the resistor 312 which is supplied with the source voltage $V_C$ at the other end thereof. The npn transistor 302 has its base connected through the diode 306 to a second terminal TM2 which is supplied with a second signal having an anti-phase to that of the first signal, and to the other end of the resistor 311, its emitter grounded, and its collector connected to the other end of the resistor 310, one end of the resistor 314 which is supplied with the source voltage $V_C$ at the other end thereof, one end of the resistor 315, and one end of the capacitor 308. The npn transistors 301 and 302 form a flip-flop circuit. Both ends of the capacitor 308 are connected in parallel with the collector and emitter of the npn transistor 302, respectively and are connected to a filter circuit which is formed of the resistors 315 and 316 and the capacitor 309. Across the resistor 316 appears a DC voltage which is inversely proportional to the frequency of the first and second signals applied to the terminals TM1 and TM2. This DC voltage is applied to the base of the pnp transistor 303. The pnp transistor 303 has its emitter connected through the resistor 317 to the base of the pnp transistor 304 and the cathode of the diode 307 which is supplied with the source voltage $V_C$ at the anode thereof, and its collector grounded. The pnp transistor 304 has its emitter supplied with the source voltage $V_C$ and its collector grounded through the resistor 318 and connected to the voltage-current converter circuit 178. Thus, a voltage proportional to the frequency of the input signal appears across the resistor 318.

The voltage-current converter circuit 178 comprises a pnp transistor 182, an npn transistor 184, a constant-current source 186, and a resistor 188. The pnp transistor 182 has its base supplied with the output voltage of the frequency-voltage converter circuit 176, its collector grounded, and its emitter connected to the base of the npn transistor 184 and one end of the constant-current source 186. The npn transistor 184 has its emitter grounded through the resistor 188 and its collector connected to the current mirror circuit 180. The other end of the constant-current source 186 is supplied with the source voltage $V_C$.

The current mirror circuit 180 comprises a pair of pnp transistors 190a and 190b. The pnp transistors 190a and 190b have their bases connected with each other and their emitters supplied with the source voltage $V_C$. The pnp transistor 190a has its collector connected to the output terminal of the voltage-current converter circuit 178 and its base. An injector current is delivered from the collector of the pnp transistor 190b, and supplied to the injector line 128.

Another constant-current source 192 supplies the injector line 128 with a current required for the low-speed operation or state hold mode of the logic section 126.

In the above-mentioned construction, when the frequency of the control signal of the frequency-voltage converter circuit 176 becomes higher, the output voltage of the circuit 176 increases, so that the output current of the voltage-current converter circuit 178 also increases. As a result, the injector current flowing into the logic section 126 through the current mirror circuit 180 becomes greater in accordance with the frequency of the control signal, that is, the operating speed of the logic section 126.

When the frequency of the control signal becomes lower, on the other hand, the injector current flowing into the logic section 126 through the current mirror circuit 180 becomes smaller.

Thus, according to this embodiment, the injector line 128 of the logic section 126 is supplied with the injector current corresponding to the operating speed of the logic section 126, so that waste of current may be reduced more fully, as compared with that of the I²L logic circuits according to the embodiments of FIGS. 3 to 8.

Figure 10:
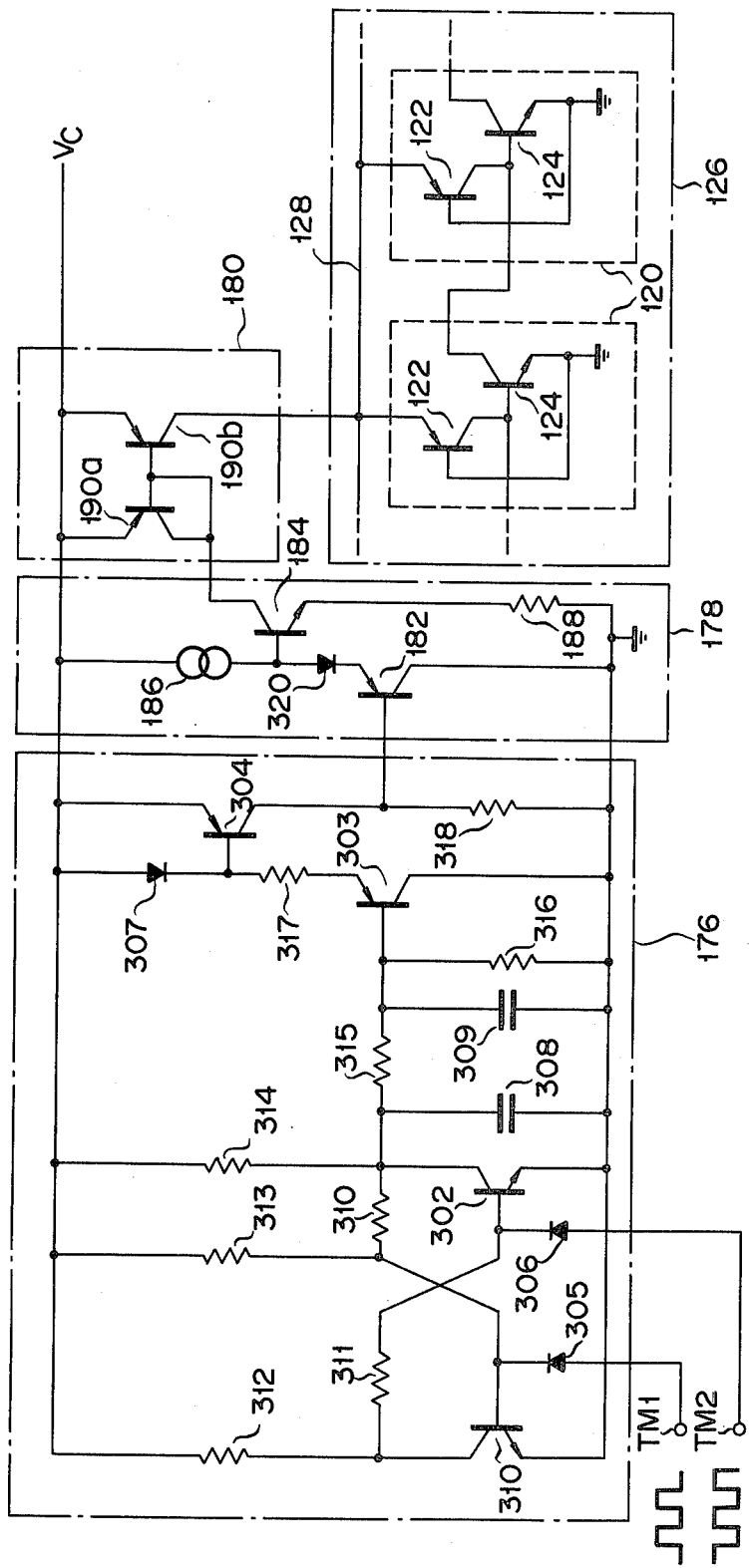

FIG. 10 shows an additional embodiment. In this embodiment, a diode 320 is provided between the emitter of the pnp transistor 182 and the base of the npn transistor 184 of the voltage-current converter circuit 178 of the embodiment of FIG. 9. The cathode and anode of the diode 320 are connected to the emitter of the pnp transistor 182 and the base of the npn transistor 184, respectively. In this case, even if no signals are supplied to the terminals TM1 and TM2, a suitable potential is supplied to the base of the npn transistor 184 by means of the diode 320 to actuate the npn transistor 184, so that a steady-state current is supplied to the logic circuit 126. Thus, it is unnecessary to use the first means (constant-current source 192 of FIG. 9) for supplying the injector line 128 with a steady-state current.

This invention is not limited to those embodiments. For example, the logic section 126 may be formed of parallel- or series-parallel-connected I²L unit circuits 120.

What we claim is:

1. An I²L logic circuit comprising:
    a logic section including at least one I²L unit circuit with a transistor for injector and a driving transistor; and
    supply means for supplying said I²L unit circuit with an injector current in response to a control signal which is a function of a desired operating speed of said I²L unit circuit, said injector current always being large enough to operate said I²L unit circuit.

2. An I²L logic circuit according to claim 1, wherein said supply means includes a first supply means for steadily supplying said I²L unit circuit with a predetermined injector current, and a second supply means for supplying said I²L unit circuit with another injector current in accordance with said control signal, said first and second supply means being connected in parallel with each other.

3. An I²L logic circuit according to claim 2, wherein said first supply means is formed of a first resistor supplied at one end with a reference potential and connected at the other end to an injector line, and said second supply means is formed of a switch circuit having an input terminal supplied with said reference potential and an output terminal connected to said injector line through a second resistor.

4. An I²L logic circuit according to claim 3, wherein said switch circuit includes a flip-flop circuit formed of first and second NAND gates, said first NAND gate having a first input terminal supplied with a set signal and a second input terminal connected with the output terminal of said second NAND gate, and said second NAND gate having a first input terminal supplied with a reset signal and a second input terminal connected with the output terminal of said first NAND gate; an npn transistor whose base is connected to the output terminal of the first NAND gate of said flip-flop circuit, whose emitter is grounded, and whose collector is connected to a third resistor; and a pnp transistor whose base is connected to the collector of said npn transistor through said third resistor, whose emitter is connected to the input terminal of said switch circuit, and whose collector is connected to the output terminal of said switch circuit.

5. An I²L logic circuit according to claim 3, wherein said switch circuit includes an I²L unit circuit driven in accordance with said control signal, the injector of the transistor for injector of said I²L unit circuit being supplied with said reference potential through a third resistor, and the driving transistor of said I²L unit circuit having its collector connected to a fourth resistor and its base supplied with said control signal; and a first pnp transistor whose base is connected to the collector of the driving transistor of said I²L unit circuit through said fourth resistor, whose collector is connected to the output terminal of said switch circuit, and whose emitter is connected to the input terminal of said switch circuit.

6. An I²L logic circuit according to claim 5, further comprising a current amplifier circuit provided between said switch circuit and said second resistor.

7. An I²L logic circuit according to claim 6, wherein said current amplifier circuit includes a first npn transistor whose base is connected to the collector of the first pnp transistor of said switch circuit and grounded through a fifth resistor, whose emitter is grounded, and whose collector is connected to a sixth resistor; a second pnp transistor whose base is connected to the collector of said first npn transistor through said sixth resistor, whose emitter is supplied with a source voltage, and whose collector is connected to a seventh resistor; a second npn transistor whose base is connected to the collector of said second pnp transistor, whose emitter is connected to the collector of said second pnp transistor through said seventh resistor and to an eighth resistor, and whose collector is supplied with said source voltage; and a third npn transistor whose base is connected to the emitter of said second npn transistor, whose emitter is connected to said second resistor and to the emitter of said second npn transistor through said eighth resistor, and whose collector is supplied with said source voltage.

8. An I²L logic circuit according to claim 2, wherein said first supply means is formed of a first reference voltage generator circuit supplied at one end with a source voltage and connected at the other end to an injector line through a first resistor, and said second supply means is formed of a second reference voltage generator circuit supplied at one end with said source voltage and connected at the other end to said injector line through a second resistor, said second reference voltage generator circuit producing a second reference voltage in accordance with said control signal.

9. An I²L logic circuit according to claim 2, wherein said first supply means is formed of a first constant-current circuit supplied at one end with a source voltage and connected at the other end to an injector line, and said second supply means is formed of a second constant-current circuit supplied at one end with said source voltage and connected at the other end to said injector line, said second constant-current circuit supplying said injector line with a current in accordance with said control signal.

10. An I²L logic circuit according to claim 2, wherein said second supply means includes a frequency-voltage converter circuit driven in accordance with a control input signal and a voltage-current converter circuit connected to said frequency-voltage converter circuit.

11. An I²L logic circuit according to claim 10, further comprising a current mirror circuit connected to said voltage-current converter circuit and having its output terminal connected to an injector line of said I²L unit circuit so that said I²L unit circuit may be supplied with said another injector current.

12. An I²L logic circuit according to claim 11, wherein said frequency-voltage converter circuit includes:
    a first diode;
    a second diode;
    a first npn transistor whose base is connected to the cathode of said first diode and whose emitter is grounded;
    a second npn transistor whose base is connected to the cathode of said second diode and whose emitter is grounded;
    a first resistor disposed between the collector of said first npn transistor and the base of said second npn transistor;
    a second resistor disposed between the base of said first npn transistor and the collector of said second npn transistor;

a third resistor connected at one end to the collector of said first npn transistor and said first resistor and supplied at the other end with a source voltage;

a fourth resistor connected at one end to the base of said first npn transistor and said second resistor and supplied at the other end with said source voltage;

a fifth resistor connected at one end to the collector of said second npn transistor and said second resistor and supplied at the other end with said source voltage;

a first capacitor disposed between the collector and emitter of said second npn transistor;

a sixth resistor connected at one end to the collector of said second npn transistor;

a second capacitor provided between the other end of said sixth resistor and the emitter of said second npn transistor;

a seventh resistor disposed between the other end of said sixth resistor and the emitter of said second npn transistor;

a first pnp transistor whose base is connected to the other end of said sixth resistor and whose collector is grounded;

an eighth resistor connected at one end to the emitter of said first pnp transistor;

a second pnp transistor whose base is connected to the other end of said eighth resistor and whose emitter is supplied with said source voltage;

a third diode whose cathode is connected to the base of said second pnp transistor and whose anode is supplied with said source voltage; and a ninth resistor connected at one end to the collector of said second pnp transistor and grounded at the other end, said voltage-current converter circuit includes:

a third pnp transistor whose base is connected to said frequency-voltage converter circuit and whose collector is grounded;

a first constant-current circuit supplied at one end with said source voltage and connected at the other end to the emitter of said third pnp transistor; and a third npn transistor whose base is connected to the emitter of said third pnp transistor and said first constant-current circuit, whose emitter is grounded through a tenth resistor, and whose collector is connected to said current mirror circuit, and said current mirror circuit includes:

fourth and fifth pnp transistors whose bases are connected with each other, said fourth pnp transistor having its collector connected to said voltage-current converter circuit and its base and having its emitter supplied with said source voltage, and said fifth pnp transistor having its emitter supplied with said source voltage and its collector connected to the injector line of said I²L unit circuit through the output terminal of said current mirror circuit.

13. An I²L logic circuit according to claim 10, 11 or 12, wherein said first supply means is a constant-current circuit supplied at one end with a source voltage and connected at the other end to an injector line.

14. An I²L logic circuit according to claim 1, wherein said supply means includes a frequency-voltage converter circuit operating in accordance with a control input signal and a voltage-current converter circuit connected to said frequency-voltage converter circuit.

15. An I²L logic circuit according to claim 14, further comprising a current mirror circuit connected to said voltage-current converter circuit and having its output terminal connected to an injector line of said I²L unit circuit so that said I²L unit circuit may be supplied with another injector current.

16. An I²L logic circuit according to claim 15, wherein said frequency-voltage converter circuit includes:

a first diode;

a second diode;

a first npn transistor whose base is connected to the cathode of said first diode and whose emitter is grounded;

a second npn transistor whose base is connected to the cathode of said second diode and whose emitter is grounded;

a first resistor disposed between the collector of said first npn transistor and the base of said second npn transistor;

a second resistor disposed between the base of said first npn transistor and the collector of said second npn transistor;

a third resistor connected at one end to the collector of said first npn transistor and said first resistor and supplied at the other end with a source voltage;

a fourth resistor connected at one end to the base of said first npn transistor and said second resistor and supplied at the other end with said source voltage;

a fifth resistor connected at one end to the collector of said second npn transistor and said second resistor and supplied at the other end with said source voltage;

a first capacitor disposed between the collector and emitter of said second npn transistor;

a sixth resistor connected at one end to the collector of said second npn transistor;

a second capacitor provided between the other end of said sixth resistor and the emitter of said second npn transistor;

a seventh resistor disposed between the other end of said sixth resistor and the emitter of said second npn transistor;

a first pnp transistor whose base is connected to the other end of said sixth resistor and whose collector is grounded;

an eighth resistor connected at one end to the emitter of said first pnp transistor;

a second pnp transistor whose base is connected to the other end of said eighth resistor and whose emitter is supplied with said source voltage;

a third diode whose cathode is connected to the base of said second pnp transistor and whose anode is supplied with said source voltage; and a ninth resistor connected at one end to the collector of said second pnp transistor and grounded at the other end, said voltage-current converter circuit includes:

a third pnp transistor whose base is connected to said frequency-voltage converter circuit and whose collector is grounded;

a fourth diode whose cathode is connected to the emitter of said third pnp transistor;

a first constant-current circuit supplied at one end with said source voltage and connected at the other end to the anode of said fourth diode; and a third npn transistor whose base is connected to the emitter of said third pnp transistor and said first constant-current circuit, whose emitter is grounded through a tenth resistor, and whose collector is connected to said current mirror circuit, and said current mirror circuit includes:
fourth and fifth pnp transistors whose bases are connected with each other, said fourth pnp transistor having its collector connected to said voltage-current converter circuit and its base and having its emitter supplied with said source voltage, and said fifth pnp transistor having its emitter supplied with said source voltage and its collector connected to the injector line of said I²L unit circuit through the output terminal of said current mirror circuit.

* * * * *